United States Patent [19]

Lee et al.

[11] Patent Number: 5,554,945

[45] Date of Patent: Sep. 10, 1996

[54] VOLTAGE CONTROLLED PHASE SHIFTER WITH UNLIMITED RANGE

[75] Inventors: Thomas H. Lee, Cupertino; Kevin S. Donnelly, San Francisco; Tsyr-Chyang Ho, San Jose, all of Calif.

[73] Assignee: Rambus, Inc., Mountain View, Calif.

[21] Appl. No.: 196,582

[22] Filed: Feb. 15, 1994

[51] Int. Cl.$^6$ .................................................. H03K 5/13
[52] U.S. Cl. ...................... 327/105; 327/107; 327/231; 327/237; 327/238; 327/266; 327/274
[58] Field of Search ................................. 327/231–238, 327/105, 355, 356, 357, 359, 250, 254, 256, 255, 107, 257, 266, 274, 280; 455/333

[56] References Cited

U.S. PATENT DOCUMENTS

| | | | |
|---|---|---|---|
| 3,296,517 | 1/1967 | Routh et al. | 327/231 |
| 3,546,604 | 12/1970 | White et al. | 327/231 |
| 3,555,458 | 1/1971 | Fombonnie | 327/231 |
| 3,911,368 | 10/1975 | Tarczy-Hornoch | 307/262 |
| 3,997,772 | 12/1976 | Crochiere et al. | 328/155 |
| 4,156,851 | 5/1979 | Winters | 328/55 |
| 4,638,190 | 1/1987 | Hwang et al. | 328/55 |
| 4,739,279 | 4/1988 | Pion | 307/262 |
| 4,806,888 | 2/1989 | Salvage et al. | 333/138 |
| 4,866,397 | 9/1989 | Kimyacioglu | 307/262 |
| 4,994,773 | 2/1991 | Chen et al. | 307/571 |
| 5,015,872 | 5/1991 | Rein | 307/262 |
| 5,157,276 | 10/1992 | Metz | 307/262 |
| 5,317,288 | 5/1994 | Yung et al. | 307/262 |

FOREIGN PATENT DOCUMENTS

054323A3  6/1982  European Pat. Off. ............... 11/20

OTHER PUBLICATIONS

PCT Search Report dated May 24, 1995, 6 pages.

*Primary Examiner*—Timothy P. Callahan
*Assistant Examiner*—T. Lam
*Attorney, Agent, or Firm*—Blakely, Sokoloff, Taylor & Zafman

[57] ABSTRACT

A voltage-controlled phase shift apparatus having an unlimited range for producing an output signal that varies in phase from an input signal by a predetermined phase difference. The phase shift apparatus includes a first delay circuit coupled to receive the input signal, the first delay circuit for outputting a first intermediate signal that is $\alpha$ degrees out of phase with the input signal, a second intermediate signal that is $\beta$ degrees out of phase with the first intermediate signal, a third intermediate signal that is 180 degrees out of phase with the first intermediate signal, and a fourth intermediate signal that is 180 degrees out of phase with the second intermediate signal. The phase shift apparatus also includes a phase interpolator circuit coupled to receive a control voltage signal and the first, second, third and fourth intermediate signals, the phase interpolator for phase mixing a selected pair of the first, second, third and fourth intermediate signals in response to the control voltage signal, the phase interpolator for outputting the output signal. A phase selector circuit coupled to the phase interpolator circuit and coupled to receive a phase slope signal and the control voltage signal selects the selected pair in response to the phase slope signal and the control voltage signal such that the output signal varies in phase from the input signal by the predetermined phase difference.

10 Claims, 11 Drawing Sheets

VOLTAGE CONTROLLED PHASE SHIFTER WITH UNLIMITED RANGE

FIELD OF THE INVENTION

The method and apparatus of the present invention relate generally to applying a phase shift to an input signal to produce an output signal and specifically to a phase shifter circuit that has an unlimited phase shift range.

BACKGROUND OF THE INVENTION

Many systems, such as delay-locked loops (DLL's), perform a phase shift of an input signal to produce a phase-shifted output signal. Such systems typically employ adjustable delay elements to provide the desired phase shift. A common example of an adjustable delay element is a current-starved inverter circuit in which the effective propagation delay of the inverter is varied by controlling, via a control voltage, the amount of current available to charge and discharge a load capacitance. Unfortunately, such prior art phase shifters typically have finite adjustment ranges. The limits of the adjustment ranges for prior art phase shifters are typically a result of the manner in which the phase shift is achieved.

Given a periodic first signal (the input signal) and a periodic second signal (the output signal) that is a delayed version of the first signal, the input and output signals are said to be "out of phase." Typical prior art phase shifters rely on the relationship between the phase difference ($\phi$) and the time delay ($\Delta t$) between the input signal and the output signal, which is expressed by the following equation:

$$\phi = 2\pi f \Delta t \quad (1)$$

The input and the output signals can be expressed by the following equations:

$$V_{in} = V_{MAX} \sin(2\pi f t); \quad (2)$$

$$V_{out} = V_{MAX} \sin(2\pi f t + \phi); \quad (3)$$

wherein VMAX is the maximum amplitude of the signal, f is the frequency and t is time. Substituting equation (1) into equation (3) yields:

$$V_{out} = A \sin 2\pi f(t + \Delta t) \quad (4)$$

When the frequency of the input signal is known, it is a simple matter to design a delay circuit to provide the maximum desired $\Delta t$. The range of time delay, and therefore phase shift, is varied by adjusting the amount of current available to charge and discharge the load capacitance. The lower endpoint of the phase adjustment range is fixed by the inherent propagation delay of the delay circuit, and the upper endpoint of the phase adjustment range is fixed by the minimum current, the load capacitance and noise considerations.

When typical prior art delay elements are used in a DLL, acquisition of lock must be carefully managed. If the frequency of the input signal is variable, there may be more than one value of the control voltage that allows lock. Further, if the loop should happen to lock with the control voltage near the limit of the delay element's range, it is possible for small disturbances or drifts in the control voltage to cause the loop to lose lock. To prevent such problems, tight restrictions are typically placed on the input frequency range. Further, the control voltage must typically be initialized near the center of the control voltage range.

SUMMARY AND OBJECTS OF THE INVENTION

Therefore, it is one object of the present invention to provide a voltage-controlled phase shifter circuit having an adjustment range of modulo $2\pi$ radians.

It is a further object of the present invention to provide a voltage-controlled phase shifter circuit having an increased input frequency range.

Another object of the present invention is to provide a voltage-controlled phase shifter circuit requiring decreased acquisition management.

A voltage-controlled phase shift apparatus is described that uses phase mixing of two intermediate signals to generate an output signal that varies in phase from an input signal by a predetermined phase difference. The phase shift apparatus includes a delay circuit coupled to receive the input signal. The delay circuit outputs a first intermediate signal that is $\alpha$ degrees out of phase with the input signal and a second intermediate signal that is $\beta$ degrees out of phase with the first intermediate signal. The phase shift apparatus also includes a phase interpolator coupled to receive a control voltage signal and the first and second intermediate signals. The phase interpolator phase mixes the first and second intermediate signals in response to the control voltage signal such that the output signal of the phase interpolator is a signal that is a sum of a first weighted fraction of the first intermediate signal and a second weighted fraction of the second intermediate signal. The control voltage determines the first and second weighted fractions, which, in turn, control the phase of the output signal.

Also described is a voltage-controlled phase shift apparatus that selectively uses two of four intermediate signals for phase mixing. The four intermediate signals divide the phase plane into four regions, allowing an output signal to have any desired phase shift. The voltage-controlled phase shift apparatus further includes a phase selector circuit that selects which two of the four intermediate signals will be phase mixed.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Illustrative embodiments of the present invention relate to providing an output signal that has a predetermined phase difference with an input signal. According to each embodiment, phase mixing is used to provide an unlimited phase adjustment range. Phase mixing includes the mixing of two intermediate signals of different phase that have some defined relationship one another. For one embodiment, the intermediate signals are four quadrature intermediate signals that have relative phases of zero, 90, 180 and 270, respectively. The output signal will always have a phase that falls within a quadrant of the phase plane that is bounded by two of the four intermediate signals. Phase mixing is accomplished by multiplying each intermediate signal that bounds the quadrant in which the phase of the output signal is located by a weighting fraction and summing the results.

Figure 1:
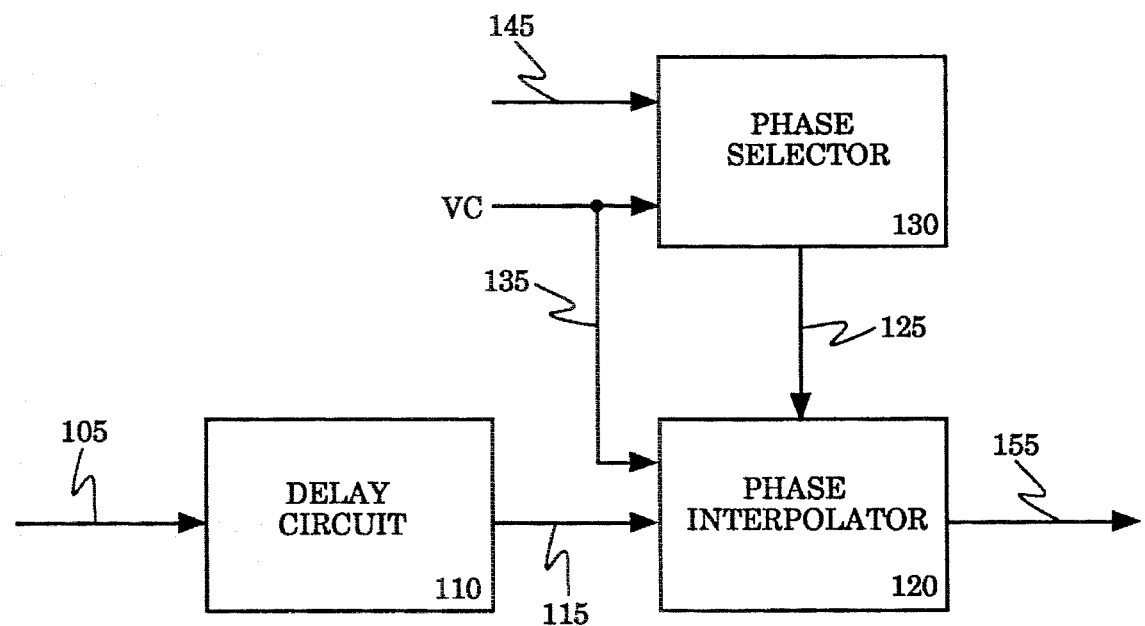
FIG. 1 illustrates a voltage-controlled phase shifter circuit of a first embodiment of the present invention.

FIG. 1 shows a voltage-controlled phase shifter circuit of a first embodiment. The phase shifter 100 includes a delay circuit 110, a phase interpolator 120 and a phase selector 130. The delay circuit 110 outputs at least two, and preferably four, intermediate signals via signal line 115 that are used in the phase mixing process by the phase interpolator 120. If only two intermediate signals are used, the first intermediate signal is preferably $\alpha$ degrees out of phase with the input signal and the second intermediate signal is preferably $\beta$ degrees out of phase with the first intermediate signal. The phase selector 130 is not required if only two intermediate signals are used. Four intermediate signals are preferably used, however, to allow an infinite phase adjustment range. When four intermediate signals are used the first and second intermediate signals are as described above wherein the third and fourth signals are 180 degrees out of phase with the first and second intermediate signals, respectively.

Phase interpolator 120 receives the intermediate signals via signal line 115. The intermediate signals are phase mixed to produce an output signal at signal line 155 having the desired phase difference, $\phi$, from the input signal in response to the control voltage signal $V_C$ that is received via signal line 135 and phase select signals that are received from the phase selector 130 via signal line 125. If only two intermediate signals are used, the phase mixing performed by the phase interpolator 120 is dependent only on the control voltage signal $V_C$, but the phase adjustment range is finite.

When the phase shift circuit is part of a feedback loop, the control voltage signal $V_C$ is increased or decreased depending on whether the phase difference between the input signal and the output signal must be adjusted to achieve the desired phase difference. The control voltage signal $V_C$ can be provided using circuitry and techniques that are well-known in the art. The phase shift circuit need not be part of a feedback loop.

When four intermediate signals are used, the phase selector 130 selects two of the four intermediate signals to be used for phase mixing. The phase selector 130 selects the two intermediate signals in response to the control voltage signal $V_C$ and a binary phase slope signal that is received via signal line 145. The phase slope signal indicates whether the phase shift of the phase shifter 100 is to increase or decrease. Further discussion of the phase selector circuit is deferred for later discussion with respect to FIGS. 8–9.

Phase mixing is based on the fact that the phase difference between the input and output signals can be expressed as a vector having a magnitude and a phase angle in the phase plane of a polar coordinate system. Given two non-collinear bounding vectors that bound a region of the phase plane, any vector that is within the bounded region of the phase plane can be expressed as the sum of a first portion of the first bounding vector and a second portion of the second bounding vector. Given two non-collinear bounding vectors and their complement vectors, the phase plane is divided into four regions, and any vector that is within any region of the phase plane can be expressed as a sum of the two vectors that bound that region. Phase mixing takes two intermediate signals that are out of phase and assigns appropriate weighting fractions to those intermediate signals to produce an output signal that has an output phase vector that is within the region bounded by and inclusive of the bounding phase vectors of the intermediate signals.

Figure 2:
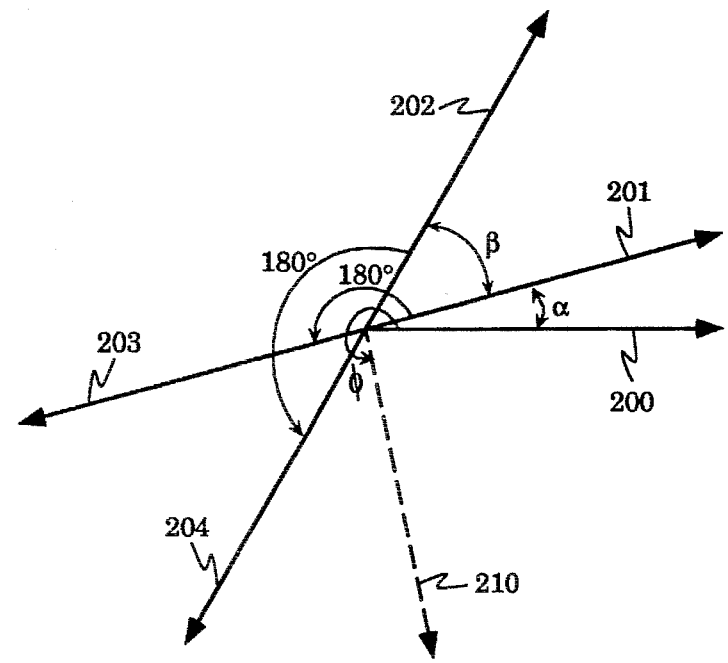
FIG. 2 shows the four intermediate signals as phase vectors in the phase plane.

FIG. 2 illustrates the four intermediate signals as phase vectors in the phase plane. The input signal is represented as the horizontal zero degree phase vector 200. It can be seen that the four intermediate signals appear to be intersecting lines and that the output signal vector 210 will always have a phase difference $\phi$ that places it between any two of the intermediate signals, 201–204. For the first embodiment, the four signals preferably have relative phases of zero, 90, 180 and 270 degrees. These signals each define one-fourth of a period of the input signal, and the term "quadrature mixing" can be substituted for "phase mixing." Using quadrature intermediate signals results in any two bounding phase vectors being 90 degrees apart, which allows the weighting fractions of the bounding quadrature phase vectors to be determined according to well-known mathematical relationships.

Figure 3:
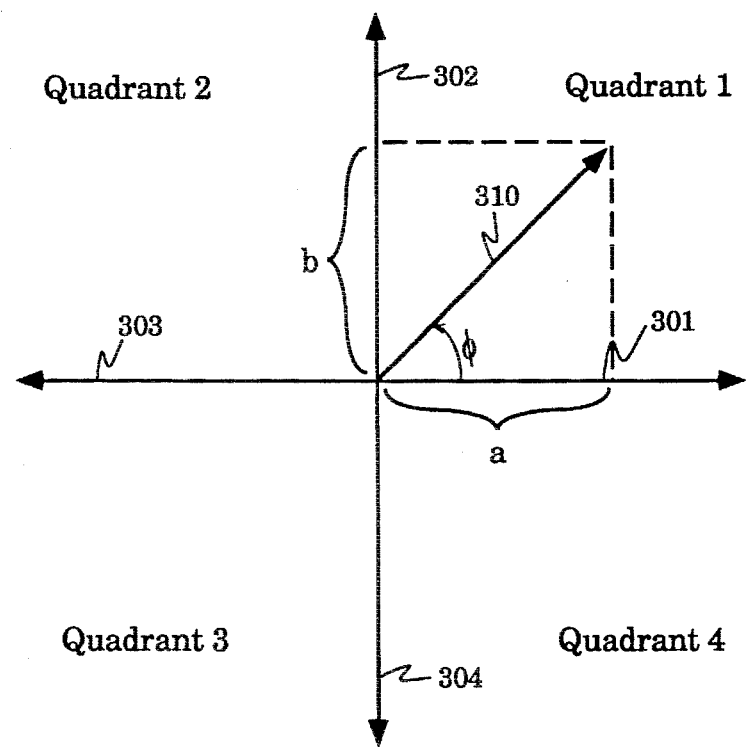
FIG. 3 describes the quadrature intermediate signals of the first embodiment as radial phase vectors in the phase plane.

FIG. 3 shows the quadrature intermediate signals of the first embodiment as radial phase vectors in the phase plane. For any output phase vector in any quadrant, the phase of the output phase vector can be determined by summing weighted fractions of the two phase vectors that bound the quadrant in which the output phase vector is found. The phase angle of the output phase vector is preferably measured from the zero degree bounding vector.

Figure 4:
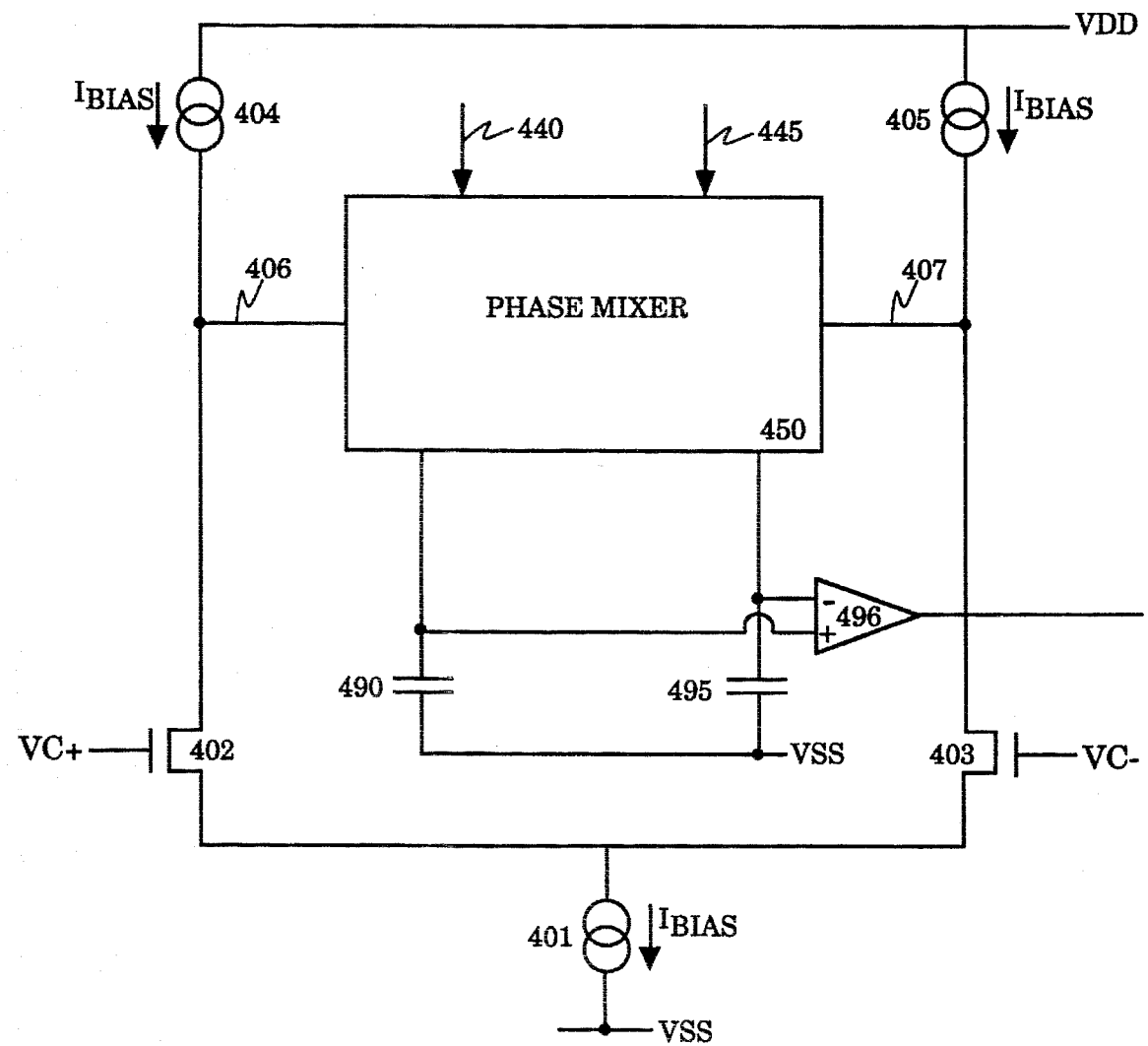
FIG. 4 illustrates a simplified phase interpolator according to the first embodiment.

FIG. 4 shows a simplified phase interpolator according to the first embodiment. The phase interpolator includes a differential pair of n-channel field effect transistors (FETs) 402 and 403. The differential control voltages $V_{C+}$ and $V_{C-}$ are coupled to the gates of FETs 402 and 403 respectively. In conjunction with fixed current sources 404 and 405, the differential pair 402 and 403 steers a differential current into branches 406 and 407 under the control of $V_{C+}$ and $V_{C-}$. The currents provided by 404 and 405 are preferably each less than the current provided by current source 401 in the embodiments to ensure that a finite difference ($V_{C+}-V_{C-}$) can result in a zero current in either branch 406 or branch 407.

The current in the right and left halves of the phase interpolator are used to charge the capacitors 490 and 495, which are coupled to the positive and negative terminals of comparator 496, respectively. The comparator 496 preferably acts as an ideal comparator, as is well-known in the art. Phase mixer 450 determines which two of the four intermediate phase vectors are to be used to couple and decouple the capacitors 490 and 495 from branches 406 and 407 in response to the select signals received via signal line 445. The intermediate signals are received via signal line 440. As $V_C$ varies, the currents flowing in the capacitors 490 and 495 varies from depending entirely on the first bounding intermediate vector to depending entirely on the second bounding intermediate vector.

The relative amount of current that is flowing into each capacitor, as set by the differential control voltage $V_C$, determines the relative rate of charging and discharging of the capacitors. The comparator 496 outputs a logic high when it detects that the voltage at the positive terminal becomes more positive than voltage at the negative terminal. Because the voltages of capacitors 490 and 495 are time varying waveforms, the comparator indicates when the waveforms of the two capacitors intersect. This point of intersection is varied by varying the differential control voltage $V_C$.

FIGS. 5A–5D illustrate the manner in which the differential control voltage $V_C$ is used to vary the phase difference $\phi$ of the output signal. The magnitude of the control voltage $|V_C|$ has a range of values between a minimum value, $V_{MIN}$, and a maximum value, $V_{MAX}$. The same range of control voltages is used in each quadrant. If the output phase vector 505 of the output signal is located in Quadrant 1, the output phase vector 505 is determined by the summation of weighted fractions of the 0 degree phase vector 501 and the 90 degree phase vector 502. When the control voltage $V_C$ is at $V_{MIN}$, the output phase vector 505 is equal to the zero degree phase vector 501 and zero weight is assigned to the 90 degree phase vector 502. When the control voltage $V_C$ is at $V_{MAX}$, the output phase vector 505 is equal to the 90 degree phase vector 502, and zero weight is assigned to the zero degree phase vector 401. An output signal having a phase difference between zero and 90 degrees can thus be achieved by mixing the zero degree intermediate signal with the 90 degree intermediate signal.

Figure 5A:
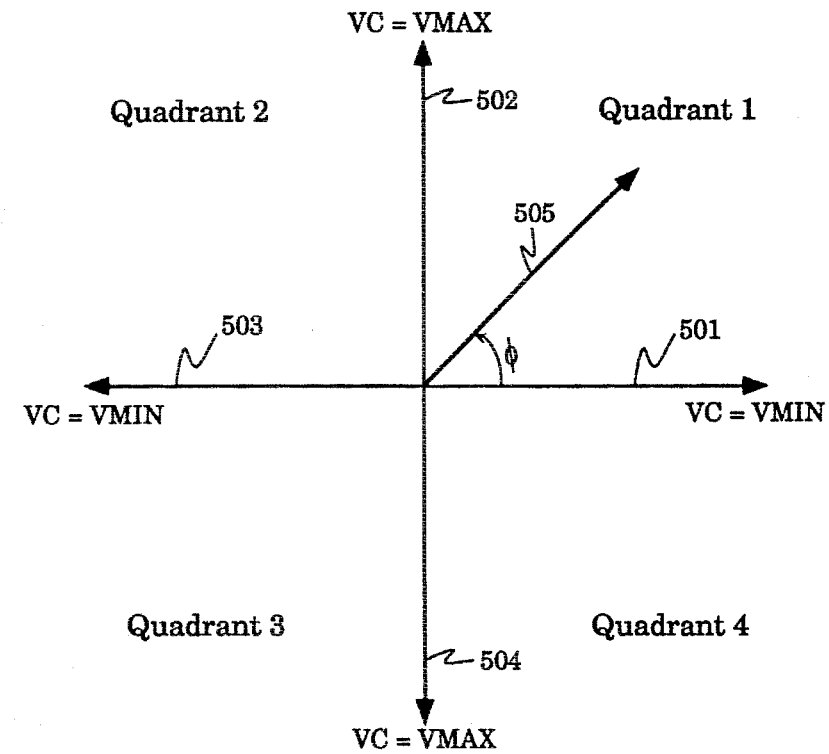
FIG. 5A shows the manner in which the control voltage $V_C$ is used to vary the phase difference $\phi$ of the output signal when the output phase vector is in quadrant 1.
Figure 5B:
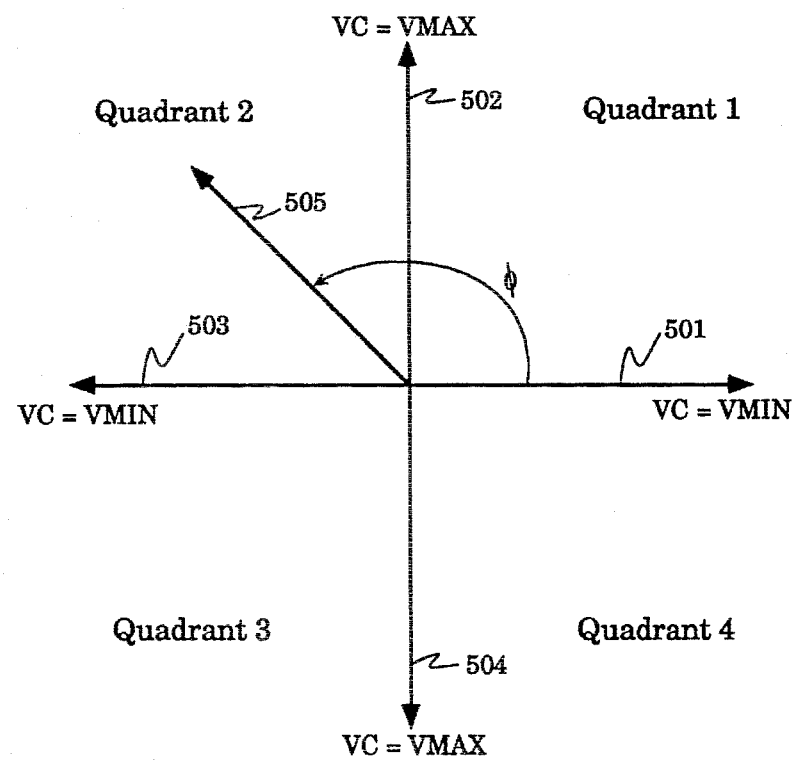
FIG. 5B illustrates the manner in which the control voltage $V_C$ is used to vary the phase difference $\phi$ of the output signal when the output phase vector is in quadrant 2.

If the control voltage $V_C$ is at either $V_{MAX}$ or $V_{MIN}$ and further phase shifting is required such that a quadrant boundary is crossed, the complement of the zero-weight phase vector is selected to replace the zero-weight phase vector. Thus, if the desired output phase vector 505 is in Quadrant 2 and $V_C$ is equal to $V_{MAX}$, the zero degree phase vector 501 is replaced with the 180 degree phase vector 503. This may occur without affecting the monotonicity of the output signal because the zero-weight intermediate signal is not a component of the output signal when the phase of the output signal is that of a quadrant boundary. The control voltage $V_C$ is then decreased towards $V_{MIN}$, and the phase difference $\phi$ of the output signal is determined by summing the weighted fractions of the 90 degree phase vector 502 and the 180 degree phase vector 503. Thus, an output signal having a phase difference between 90 and 180 degrees can be achieved by mixing the 90 and 180 degrees intermediate signals. This is shown in FIG. 5B.

Figure 5C:
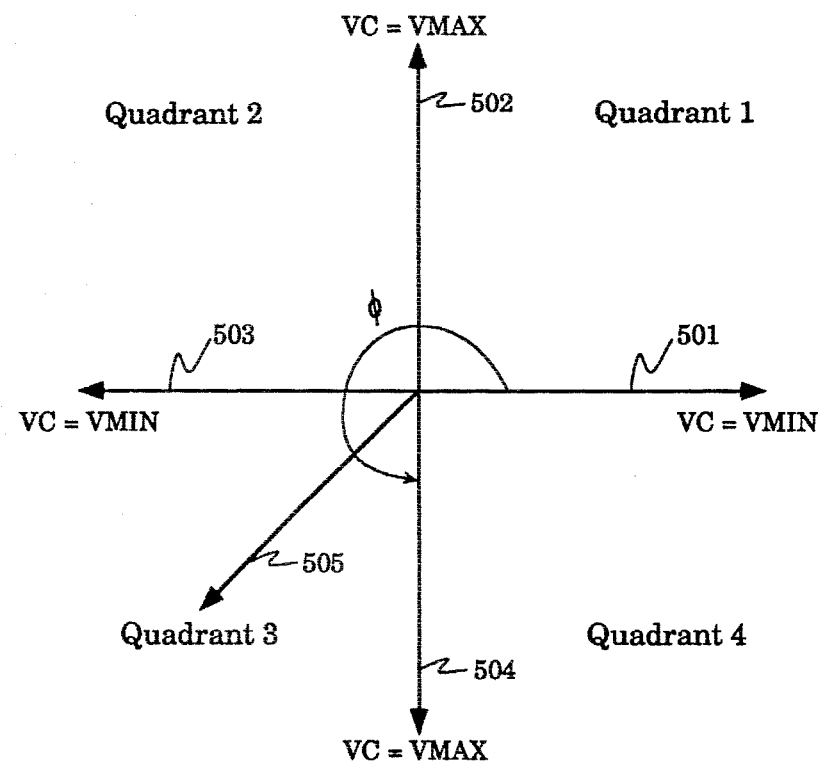
FIG. 5C shows the manner in which the control voltage $V_C$ is used to vary the phase difference $\phi$ of the output signal when the output phase vector is in quadrant 3.
Figure 5D:
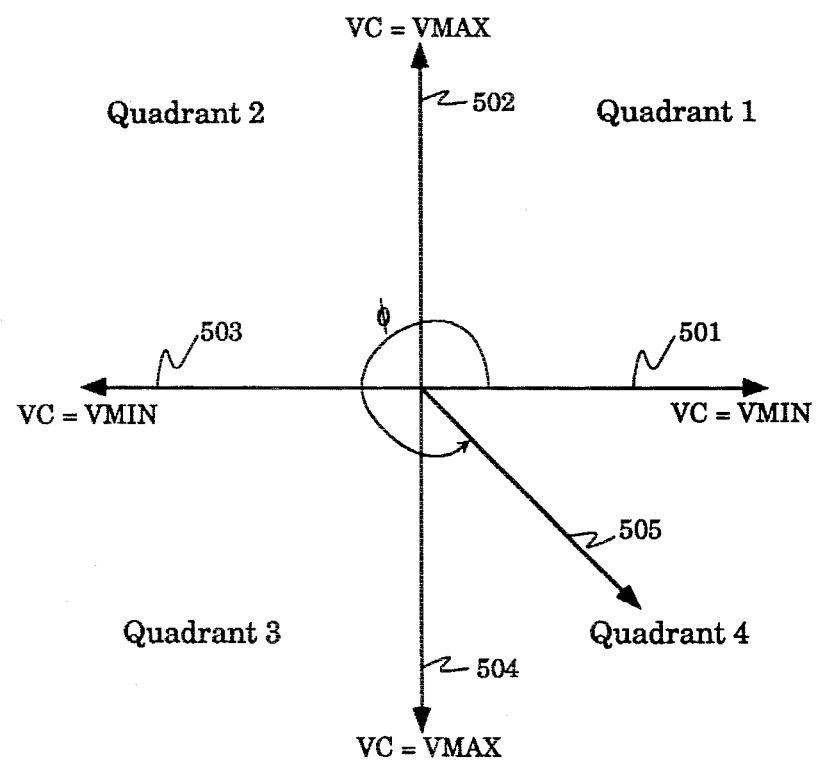
FIG. 5D illustrates the manner in which the control voltage $V_C$ is used to vary the phase difference $\phi$ of the output signal when the output phase vector is in quadrant 4.

As $V_C$ decreases towards $V_{MIN}$, greater weight is assigned to the 180 degree phase vector 403. Should $V_C$ drop to $V_{MIN}$ and further phase shifting be required such that the desired output phase vector 505 is in Quadrant 3, the 270 degree phase vector 504 replaces the 90 degree phase vector 502, and the control voltage $V_C$ is increased towards $V_{MAX}$ such that the weight of the 270 degree phase vector 504 increases. This is shown in FIG. 5C. The desired output phase vector 505 will be in Quadrant 4 should the control voltage be equal to $V_{MAX}$ and a further increase of the phase difference be required. This is shown in FIG. 5D. If the phase difference must be further increased, the quadrant boundaries can be crossed any number of times such until the output phase vector is in the appropriate quadrant. The phase difference can be decreased in a similar manner. Each full revolution through the phase plane constitutes 360 degrees, or $2\pi$ radians, of phase difference $\phi$ in addition to the phase difference attained in the quadrant of the output phase vector. Thus, the phase shifter circuit of the first embodiment provides a modulo $2\pi$ phase shift. Any fixed delay that is a product of the phase shifter circuit can be compensated for by a feedback loop.

Figure 6:
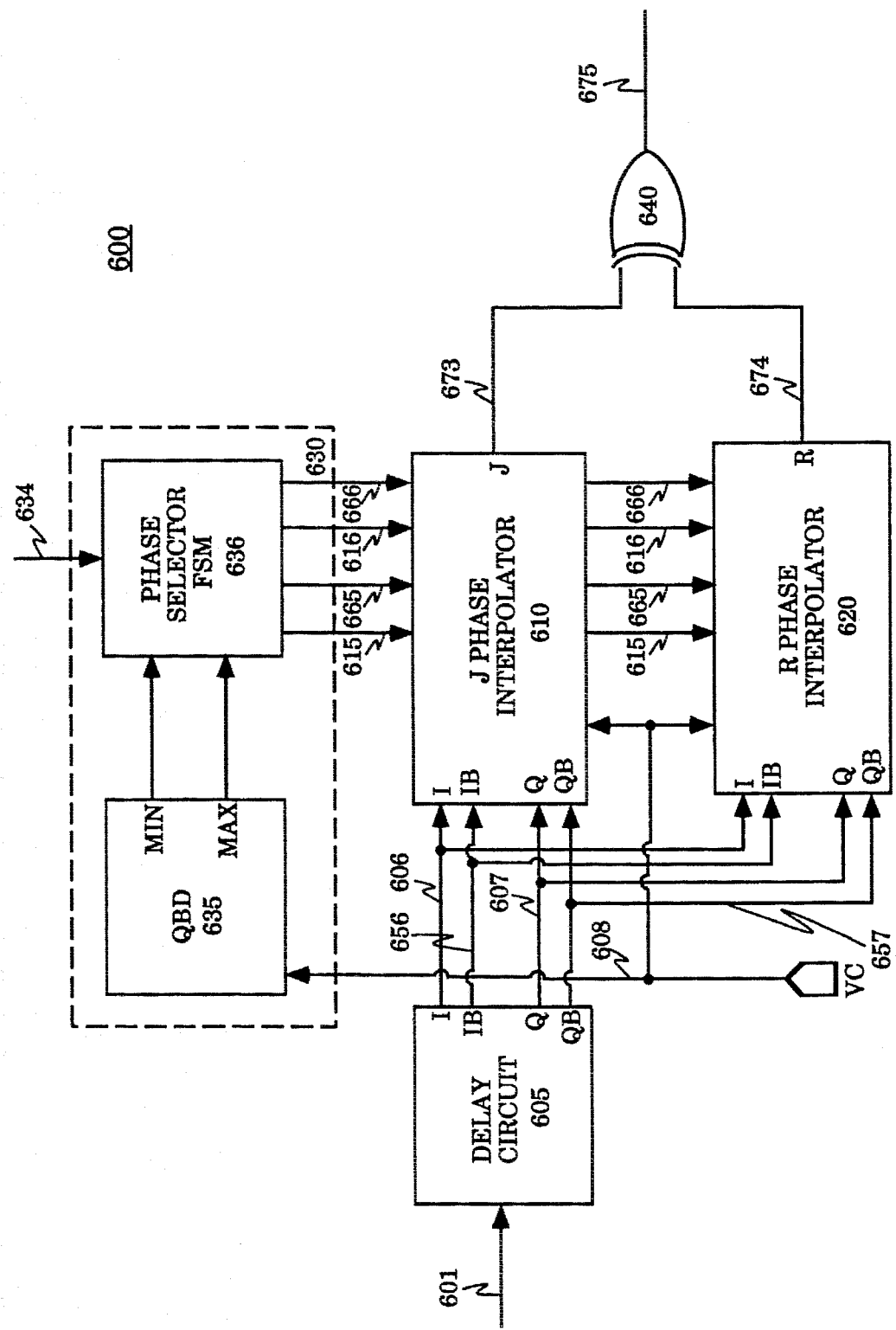
FIG. 6 shows a phase shifter circuit according to a second embodiment.

FIG. 6 illustrates a phase shifter circuit according to a second embodiment. The input signal is received by the phase shifter 600 via signal line 601. In the phase shifter circuit of the second embodiment, the delay circuit 605 divides the frequency of the input signal in half and outputs quadrature intermediate signals having half the frequency of the input. The zero and 180 degree intermediate signals are the I complementary pair "I" and "IB", respectively. The 90 and 270 degree intermediate signals are the Q complementary pair "Q" and "QB", respectively. The I, IB, Q, QB vectors are output to the J phase interpolator 610 and the R phase interpolator 620 via signal line 606, 656, 607 and 657, respectively.

The phase selector circuit 630 of the second embodiment preferably includes a quadrant boundary detector (QBD) 635 and a phase selector finite state machine (FSM) 636. The phase selector FSM 636 selects which two of the quadrature intermediate signals are to be mixed in response to the output of the quadrant boundary detector (QBD) 635 and a phase slope signal received via signal line 634. The phase slope signal indicates whether the phase difference $\phi$ is to increase or decrease, wherein the QBD 635 indicates when a quadrant boundary is being crossed. The phase selector FSM 630 uses the information received from the QBD 635 and the signal line 634 to determine which quadrant the output signal is in so that it may select the two quadrature intermediate signals that are to be used for mixing. In this embodiment, the selection of the intermediate signals are made by asserting active low ISEL, for I, IBSEL for IB, QSEL for Q, and QBSEL for QB. The ISEL and QSEL complementary pairs are output by the phase selector FSM 636 via signal lines 615, 665, 616 and 666, respectively.

The control voltage $V_C$ controls the weighting fractions for the mixing of the selected intermediate signals. The control voltage $V_C$ is also used by the QBD 635 to determine when a quadrant boundary is being crossed. The control voltage $V_C$ is preferably a differential input voltage VC+ and VC− for better noise rejection, as is well known in the art.

The J phase interpolator 610 outputs via signal line 673 a first output signal J that is the product of quadrature mixing.

The R phase interpolator 620 is substantially identical to the J phase interpolator 610, but it outputs a second output signal R via signal line 674 that is 90 degrees out of phase with the first output signal J. The XOR gate 640 receives J and R as inputs, and outputs a final output signal via signal line 675 that is of the same frequency as the input signal and has the desired phase shift via signal line 602. The XOR gate acts to double the frequency of the input signals, as is well known in the art. The XOR gate 640 and the R phase interpolator 620 are not required if the frequency divider 605 is not used.

Figure 7:
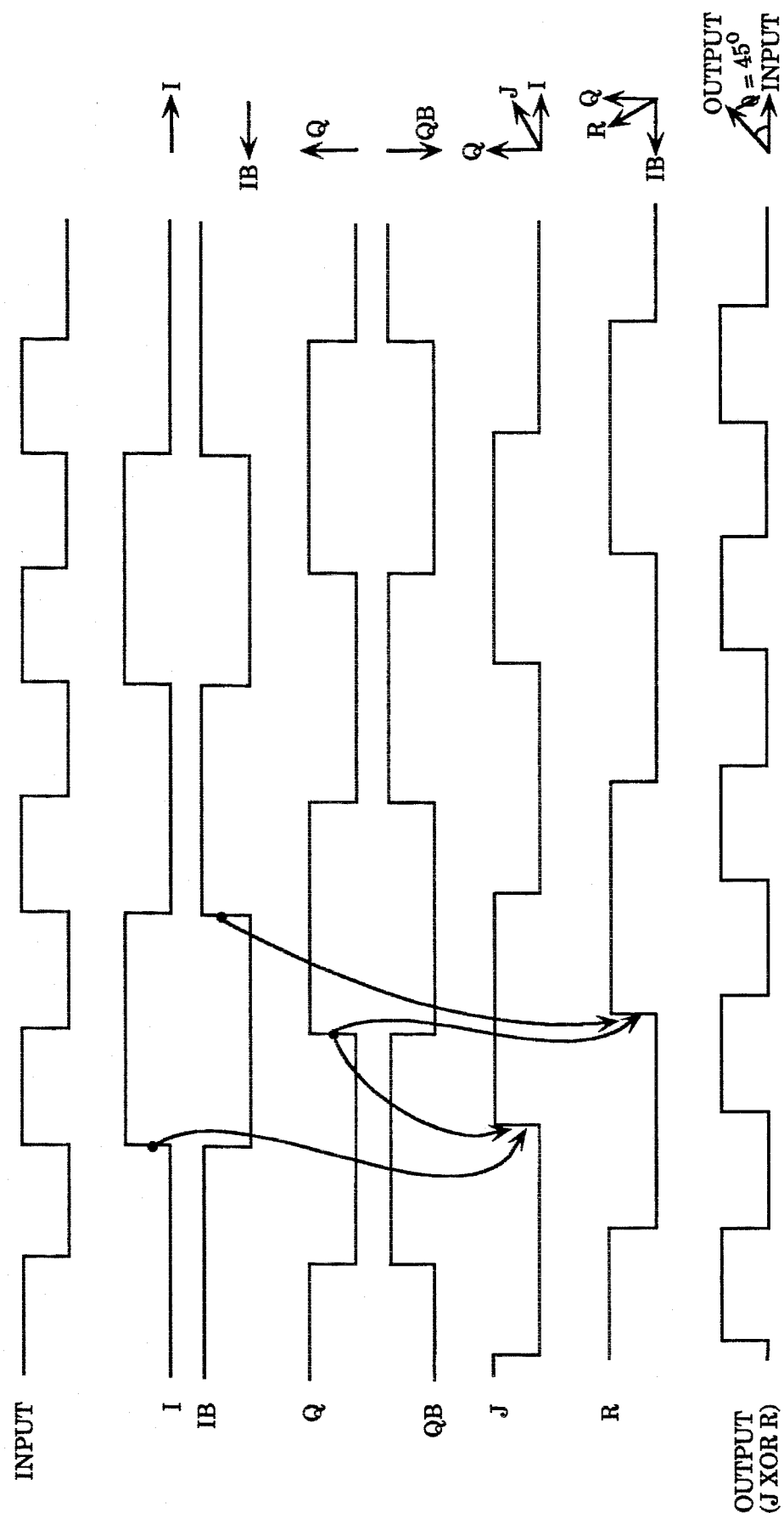
FIG. 7 is a timing diagram illustrating the operation of the phase shifter circuit of the second embodiment.

FIG. 7 is a timing diagram illustrating the operation of the phase shifter circuit of the second embodiment. As shown, the quadrature intermediate signals I, IB, Q and QB are all half the frequency of the input signal. When the desired phase difference between the output signal and the input signal is 45 degrees, the J output signal of the J phase interpolator is 22.5 degrees out of phase with the I intermediate signal, and the J output phase vector is a mixture of the I and Q phase vectors. The R output signal, as discussed above, is 90 degrees out of phase with the J output signal, which is equal to 112.5 degrees out of phase with the I intermediate signal and 22.5 degrees out of phase with the Q intermediate signal. The R output phase vector is a mixture of the Q and IB phase vectors. The output signal, which is equal to J XOR R, is of the same frequency as the input signal and is phase shifted from the input signal by 45 degrees.

Figure 8:
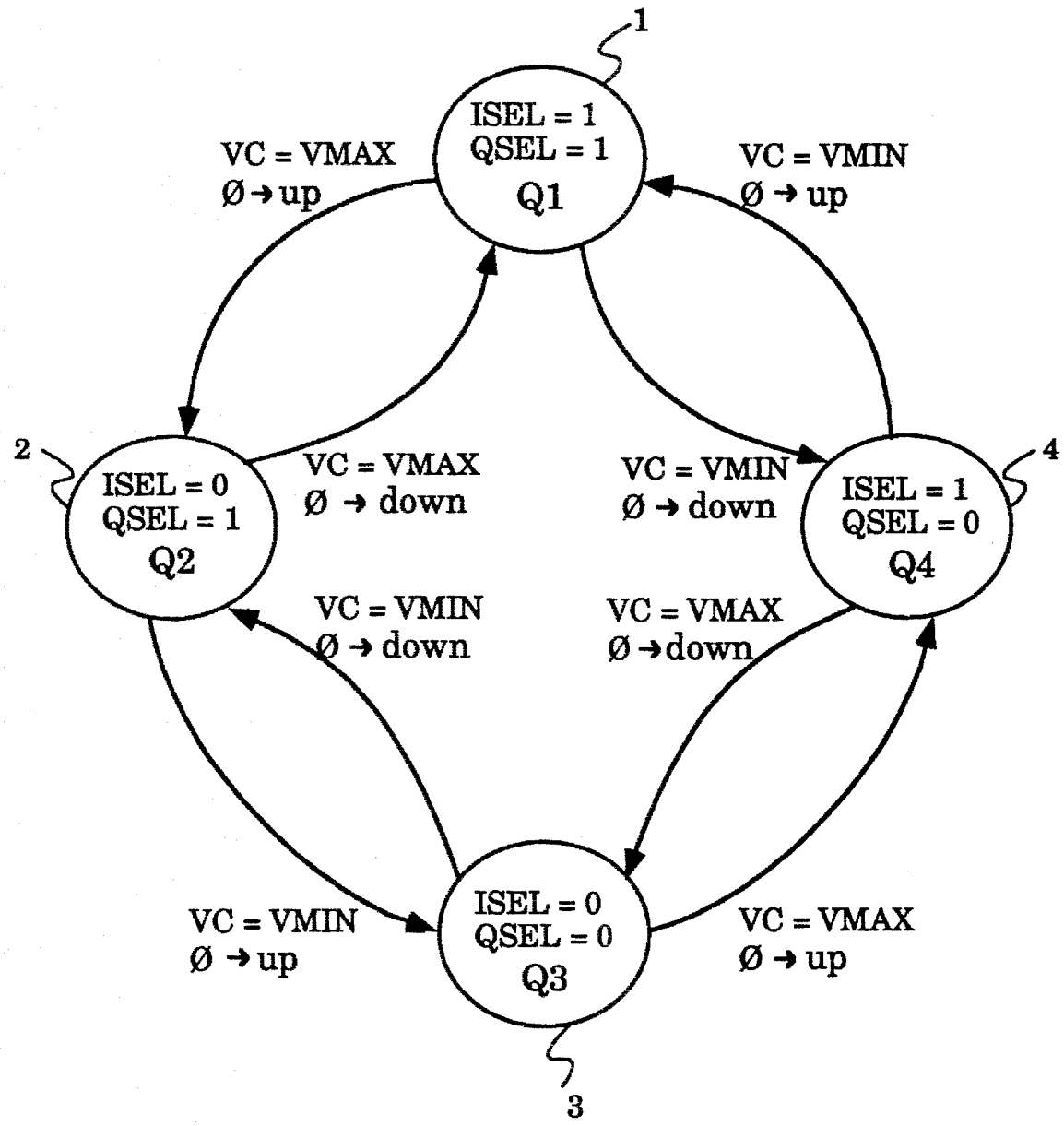
FIG. 8 is a state diagram for the phase selector FSM, according to the second embodiment.

FIG. 8 illustrates a state diagram for the phase selector FSM, according to the second embodiment. The phase selector FSM preferably has four possible states, one state corresponding to each quadrant. In state 1, which corresponds to Quadrant 1, the phase selector FSM selects ISEL and QSEL as active. If $V_C$ is equal to $V_{MAX}$ and $\phi$ is to increase (go "up"), the FSM deselects ISEL, causing ISELB to go active. This changes the state of the phase selector FSM from state 1 to state 2, which corresponds to Quadrant 2. While in state 2, should $V_C$ be equal to $V_{MAX}$ when $\phi$ is to decrease (go "down"), the state of the phase selector FSM goes from state 2 to state 1. If, in state 2, $V_C$ should fall to $V_{MIN}$ when $\phi$ is to increase, the FSM deselects QSEL, causing QSELB to go active, changing the state of the phase selector FSM to state 3. The phase selector FSM switches from state 3 to state 4 when $V_C$ is at $V_{MAX}$ when $\phi$ is to increase by selecting ISEL, causing ISELB to go inactive. As can be seen, if MAX or MIN is asserted and the phase difference is to decrease, the phase selector FSM will change state in a clockwise direction according to the state diagram.

Figure 9:
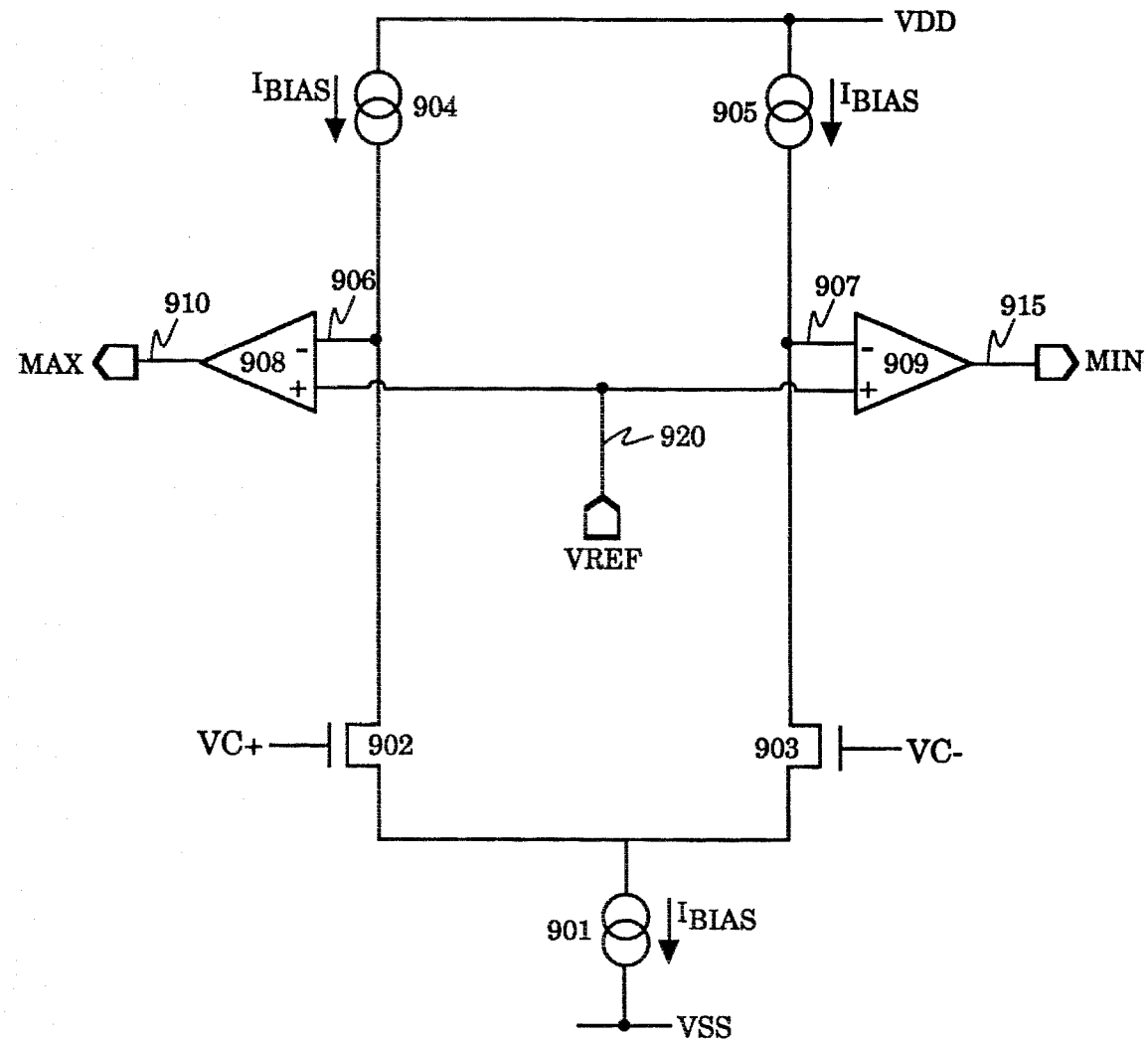
FIG. 9 illustrates the quadrant boundary detector of the second embodiment.

FIG. 9 shows the quadrant boundary detector of the second embodiment. The QBD 900 preferably includes a differential pair of n-channel FETs 902 and 903. The drains of FETs 902 and 903 are coupled to current sources 904 and 905, respectively. The current sources act as high impedance loads. The current source 901 is coupled to the sources of both FETs 902 and 903. The differential pair and the current sources of the QBD are preferably substantially identical to the analogous differential pair and current sources of the phase interpolator circuits. The differential input voltage $V_C$ directs current through the differential pair. If $V_C$ is at its maximum value, FET 903 is switched off, FET 902 is fully conducting, and the voltage at branch 906 is less than $V_{REF}$. The comparator 908 outputs a MAX signal via signal line 910 indicating that $V_C$ is at the maximum value. If $V_C$ is at its minimum value, FET 902 is switched off, FET 903 is fully conducting, and the voltage at branch 907 is less than $V_{REF}$. The comparator 909 outputs a MIN signal via signal line 915 indicating that $V_C$ is at the minimum value. The reference voltage $V_{REF}$ is chosen such that only one of the MAX or MIN signals can be asserted active at one time. In the second embodiment, the currents provided by current sources 904 and 905 are each less than the current provided by the current source 901 such that a finite difference (VC+–VC–) can result in a low voltage at branches 906 or 907.

Figure 10:
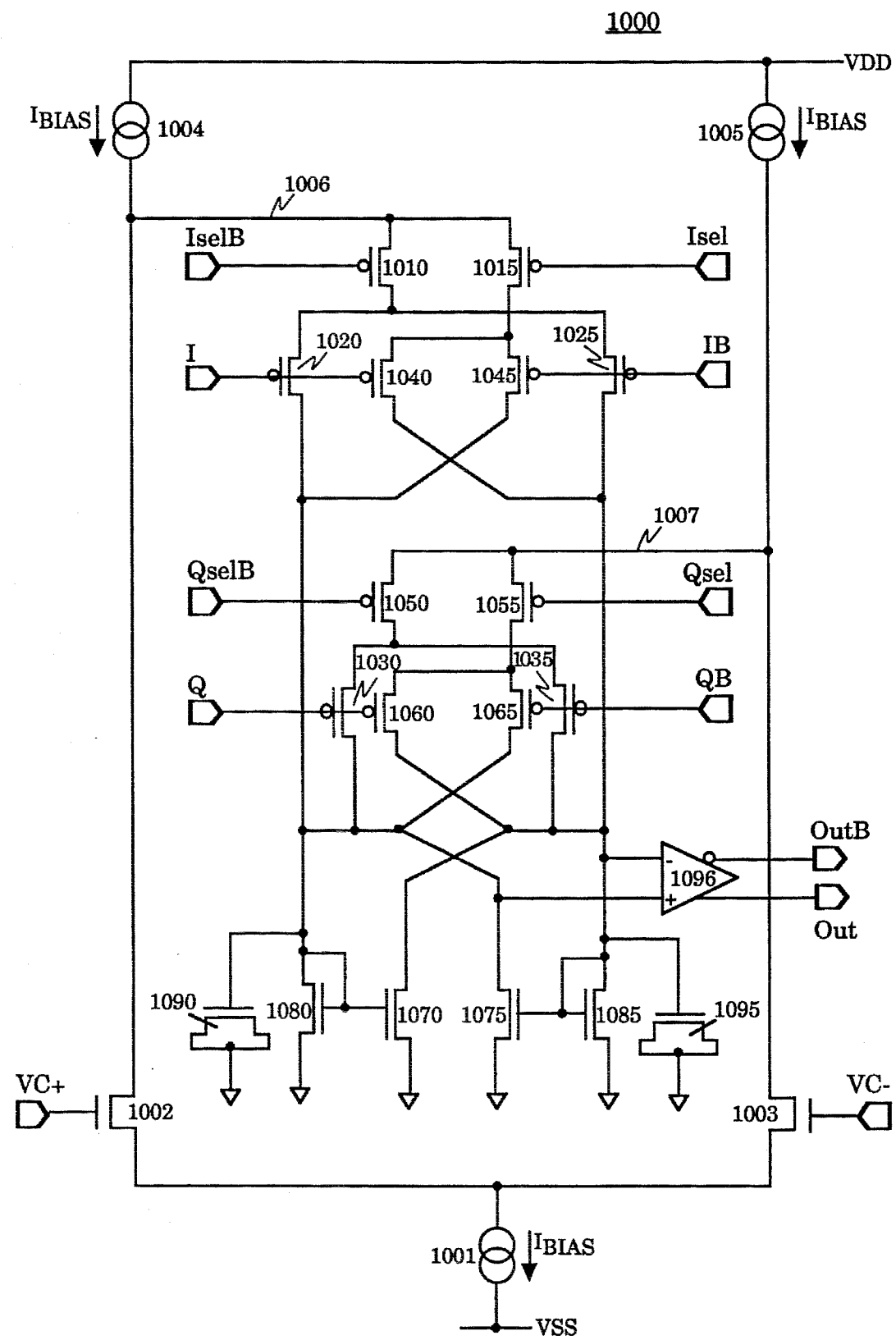
FIG. 10 shows a phase interpolator for producing the J output phase vector according to the second embodiment.

FIG. 10 shows a phase interpolator for producing the J output phase vector according to the second embodiment. In this case where no frequency divider is used, this phase interpolator is preferably used alone. In the phase interpolator circuit 1000, the differential pair and current sources behave as described with respect to FIG. 4. The mixing circuit of the phase interpolator circuit includes p-channel FETs 1010, 1015, 1020, 1025, 1030, 1035, 1040, 1045, 1050, 1055, 1060, and 1065. The select signals ISEL, ISELB, QSEL and QSELB are active low and are coupled such that the phase interpolator operates according to the state diagram of FIG. 8.

The value of the differential control voltage $V_C$ determines the amount of current that is steered through the right and left halves of the phase interpolator. The current in branch 1006 is equal to the difference of the current supplied by current source 1004 and the drain current of FET 1002. Similarly, the current in branch 1007 is equal to the difference of the current provided by current source 1005 and the drain current of FET 1003. When $V_C$ is equal to $V_{MAX}$, FET 1002 is switched completely on by the $V_{C+}$ differential control voltage such that FET 1002 conducts substantially all of the current from current source 1001. The negative differential control voltage $V_{C-}$ is negative such that FET 1003 is not conducting. This means that current flows through branch 1007, and no current flows through branch 1006. When $V_C$ is equal to $V_{MIN}$, substantially all of the current provided by current source 1001 flows through FET 1003. Thus, current flows through branch 1006, and no current flows through branch 1007. Control voltage levels $V_C$ between $V_{MAX}$ and $V_{MIN}$ allow current to flow through both branches 1006 and 1007.

The current that flows through branches 1006 and 1007 is steered to the FETs 1090 and 1095, which are coupled as capacitors, via the FETs 1010, 1015, 1050 and 1055. Capacitor FETs 1090 and 1095 can be replaced by known prior art capacitive devices. The capacitor FET 1090 is coupled between ground and the positive terminal of comparator 1096. The capacitor FET 1095 is coupled between ground and the negative terminal of the comparator 1096. The timing of the output signal of the comparator 1096 is determined by when the charging and discharging waveforms of the capacitor FETs 1090 and 1095 intersect. The weighting of the input vectors and, thus, the phase difference $\phi$ of the J output phase vector of the phase interpolator, is therefore determined by the differential pair of FETs 1002 and 1003, which set the rate at which capacitor FETs 1090 and 1095 are charged by steering current through the right and left halves in response to the differential control voltage $V_C$.

The precise steering of the current through the right and left sides of the differential pair is determined by which two of the four select lines are selected. In this particular circuit, all of the select switch FETs 1010, 1015, 1050 and 1055 are active low p-channel devices. As discussed above with respect to FIG. 8, the phase interpolator is in Quadrant 1 when ISEL and QSEL are active, which causes the select switch FETs 1015 and 1055 to be switched on, coupling branch 1006 to the sources of FETs 1040 and 1045 and coupling branch 1007 to the sources of FETs 1060 and 1065.

If the control voltage $V_C$ is equal to $V_{MIN}$, the output vector of the phase interpolator depends entirely on the I intermediate vector. This follows from the fact when $V_C$ is equal to $V_{MIN}$, the FET 1002 is switched off and FET 1003 is switched on such that a maximum current flows through branch 1006 and no current flows through branch 1007. The capacitor FET 1095 is charged and discharged in response to the intermediate vector I, which switches the FET 1040 on and off, coupling and decoupling the capacitor FET 1095 from the branch 1006. Similarly, the capacitor FET 1090 is charged and discharged in response to the intermediate vector IB, which switches the FET 1045 on and off, coupling and decoupling the capacitor FET 1090 from the branch 1006. Capacitor FETs 1090 and 1095 are not charged and discharged in response to intermediate vectors Q and QB, however, because no current flows through branch 1007 into FETs 1060 and 1065. Thus, there is zero weight on the Q intermediate vector.

If the control voltage $V_C$ is equal to $V_{MAX}$, the J output vector of the phase interpolator depends entirely on the Q intermediate vector. This follows from the fact when $V_C$ is equal to $V_{MAX}$, the FET 1003 is switched off and FET 1002 is switched on such that a maximum current flows through branch 1007 and no current flows through branch 1006. The capacitor FET 1095 is charged and discharged in response to the intermediate vector Q, which switches the FET 1060 on and off, coupling and decoupling the capacitor FET 1095 from the branch 1007. Similarly, the capacitor FET 1090 is charged and discharged in response to the intermediate vector QB, which switches the FET 1065 on and off, coupling and decoupling the capacitor FET 1090 from the branch 1007. If the differential control voltage $V_C$ is equal to some value between $V_{MIN}$ and $V_{MAX}$, the J output phase vector of the phase interpolator 1000 is between the I and Q intermediate vectors.

When the output phase vector is in Quadrant 2, the QSEL and ISELB are active low, causing select switch FETs 1055 and 1010 to be switched on. Branch 1007 remains coupled as described above with respect to Quadrant 1 output phase vectors. Similarly, selecting QSELB results in a relationship between the intermediate vectors Q and QB and the capacitor FETs 1090 and 1095 that is the inverse of the relationship when QSEL is selected.

The rate at which the capacitor FETs 1090 and 1095 are charged and discharged is also affected by the transistor pairs of FETs 1080 and 1070 and FETs 1085 and 1075. The FET 1080 is coupled as a diode for biasing the current mirror FET 1070. When a positive current flows through the left side of the interpolator to charge capacitor FET 1090, the current mirror FET 1070 discharges the capacitor FET 1095 by drawing current of equal magnitude from the capacitor FET 1095. In this manner, the voltage swing between the negative and positive terminals of the comparator 1096 behaves differentially, and the inputs to the comparator are slew-limited. The FETs 1085 and 1075 behave similarly. These transistor pairs result in a high differential impedance and a low common-mode impedance.

Figure 11:
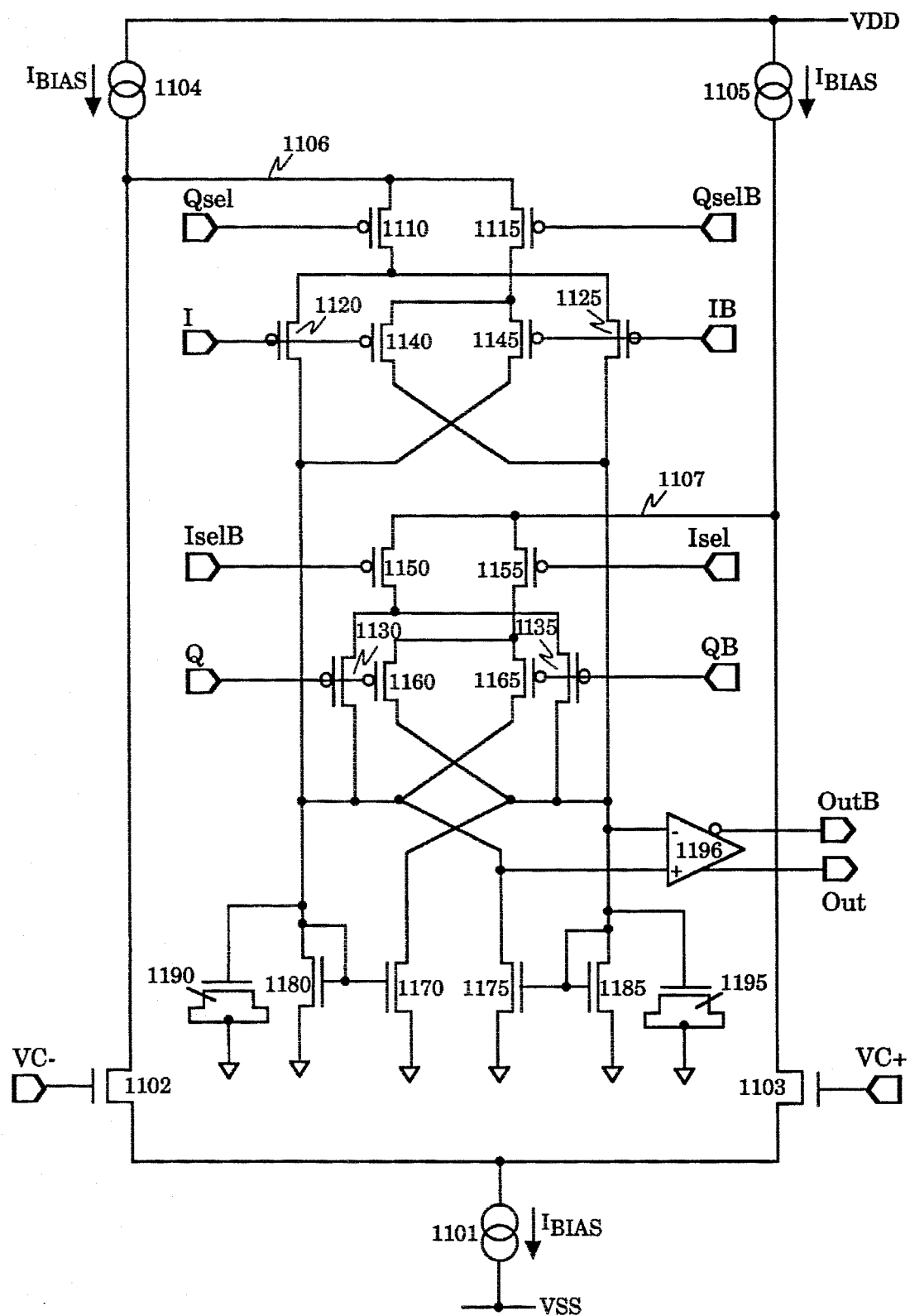
FIG. 11 illustrates a phase interpolator for producing the R output phase vector according to the second embodiment of the present invention.

FIG. 11 shows the R vector phase interpolator according to the second embodiment. The R vector is by definition 90 degrees out of phase with the J vector. For one method to achieve the 90 degree phase shift, the select lines are re-routed in the phase interpolator 1100 and the control voltage lines $V_{C+}$ and $V_{C-}$ are reversed, as shown. The phase interpolator 1100 is otherwise identical to the phase interpolator of FIG. 10. Alternatively, the 90 degree phase shift may also be accomplished by rerouting the intermediate signals without changing the select lines or the control voltage lines.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A phase shift apparatus for producing an output signal that varies in phase from an input signal by a predetermined phase difference in response to a control voltage, the phase shift apparatus comprising:

a first delay circuit coupled to receive the input signal, the first delay circuit for outputting a first intermediate signal that is α degrees out of phase with the input signal and a second intermediate signal that is β degrees out of phase with the first intermediate signal; and a phase interpolator circuit coupled to receive the control voltage signal, the first intermediate signal, and the second intermediate signal, the phase interpolator for phase mixing the first and second intermediate signals in response to the control voltage signal to produce the output signal such that an output vector representative of the output signal is a sum of a first fraction of a first vector representative of the first intermediate signal and a second fraction of a second vector representative of the second intermediate signal, wherein the control voltage is a differential voltage VC+ and VC−, the phase interpolator comprising:

a first transistor including a first terminal for receiving a supply current, a second terminal for dispensing the supply current, and a third terminal for controlling the amount of supply current flowing from the first terminal to the second terminal in response to VC+;

a second transistor including a first terminal for receiving a supply current, a second terminal for dispensing the supply current, and a third terminal for controlling the amount of supply current flowing from the first terminal of the second transistor to the second terminal of the second transistor in response to VC−;

a first capacitor having a first terminal and a second terminal, wherein the first terminal of the first capacitor is coupled to system ground;

a second capacitor having a first terminal and a second terminal, wherein the first terminal of the second capacitor is coupled to system ground;

a comparator having a negative input coupled to the second terminal of the first capacitor and a positive input coupled to the second terminal of the second capacitor, the comparator for outputting the output voltage;

a phase mixer circuit including a first input coupled to the second terminal of the first transistor, a second input coupled to the second terminal of the second transistor, a first output coupled to the second terminal of the first capacitor, and a second output coupled to the second terminal of the second capacitor, the phase mixer circuit for coupling and decoupling the first input to the first output in response to the first intermediate signal, and for coupling and decoupling the second input to the second output in response to the second intermediate signal.

2. A phase shift apparatus for producing an output signal that varies in phase from an input signal by a predetermined phase difference in response to a control voltage, the phase shift apparatus comprising:

a first delay circuit coupled to receive the input signal, the first delay circuit for outputting a first intermediate signal that is α degrees out of phase with the input signal, a second intermediate signal that is β degrees out of phase with the first intermediate signal, a third intermediate signal that is 180 degrees out of phase with the first intermediate signal, and a fourth intermediate signal that is 180 degrees out of phase with the second intermediate signal;

a phase interpolator circuit coupled to receive a control voltage signal and the first, second, third and fourth intermediate signals, the phase interpolator for phase mixing a selected pair of the first, second, third and fourth intermediate signals in response to the control voltage signal to produce the output signal such that an output vector representative of the output signal is a sum of fractions of vectors representative of each selected intermediate signal of the selected pair; and a phase selector circuit coupled to the phase interpolator circuit and coupled to receive a phase slope signal and the control voltage signal, the phase selector circuit for selecting the selected pair in response to the phase slope signal and the control voltage signal such that the output signal varies in phase from the input signal by the predetermined phase difference, wherein the phase selector circuit includes:

a quadrant boundary detector for outputting a MAX signal when the control voltage is at a maximum voltage level and a MIN signal when the control voltage is at a minimum voltage level, the MAX and MIN signals indicating when a weighted fraction for a selected intermediate signal of the first selected pair is equal to zero;

a phase selector state machine coupled to receive the MAX signal, the MIN signal and the phase slope signal, the phase selector for selecting the selected pair in response to the MAX signal, the MIN signal and the phase slope signal by asserting as active two of a plurality of select signals, said plurality of select signals including an ISEL signal, an ISELB signal, a QSEL signal and a QSELB signal.

3. The phase shift apparatus of claim 2, wherein the control voltage is a differential voltage VC+ and VC−, the phase interpolator comprising:

a first transistor including a first terminal for receiving a supply current, a second terminal for dispensing the supply current, and a third terminal for controlling the amount of supply current flowing from the first terminal of the first transistor to the second terminal of the first transistor in response to VC+;

a second transistor including a first terminal for receiving a supply current, a second terminal for dispensing the supply current, and a third terminal for controlling the amount of supply current flowing from the first terminal of the second transistor to the second terminal of the second transistor in response to VC−;

a first capacitor having a first terminal and a second terminal, wherein the first terminal of the first capacitor is coupled to system ground;

a second capacitor having a first terminal and a second terminal, wherein the first terminal of the second capacitor is coupled to system ground;

a comparator having a negative input coupled to the second terminal of the first capacitor and a positive input coupled to the second terminal of the second capacitor, the comparator for outputting the output voltage;

a phase mixer circuit coupled to receive the plurality of select signals and the intermediate signals, the phase mixer circuit including a first input coupled to the second terminal of the first transistor, a second input coupled to the second terminal of the second transistor, a first output coupled to the second terminal of the first capacitor, and a second output coupled to the second terminal of the second capacitor, the phase mixer circuit for coupling and decoupling the first input to the first output in response to a selected one of the first and third intermediate signals, and for coupling and decoupling the second input to the second output in response to a selected one of the second and fourth intermediate signals.

4. The phase shift apparatus of claim 3, wherein the phase mixer circuit couples and decouples the first input to the second output in response to the third intermediate signal when the first intermediate signal is selected to couple and decouple the first input to the first output.

5. A phase shift apparatus for producing an output signal that varies in phase from an input signal by a predetermined phase difference in response to a control voltage, the phase shift apparatus comprising:

a delay circuit coupled to receive the input signal, the delay circuit for outputting a first intermediate signal, a second intermediate signal that is 90 degrees out of phase with the first intermediate signal, a third intermediate signal that 180 degrees out of phase with the first intermediate signal, and a fourth intermediate signal that is 270 degrees out of phase with the first intermediate signal, the delay circuit including a frequency divider circuit for dividing an input frequency of the input signal in half such that a intermediate frequency of the first, second, third and fourth intermediate signals is equal to half of the input frequency;

a first phase interpolator circuit coupled to receive a control voltage signal and the first, second, third and fourth intermediate signals, the first phase interpolator for phase mixing a first selected pair of the first, second, third and fourth intermediate signals in response to the control voltage signal to produce a first output signal such that an output vector representative of the first output signal is a sum of fractions of vectors representative of each selected intermediate signal of the first selected pair;

a second phase interpolator circuit coupled to receive a control voltage signal and the first, second, third and fourth intermediate signals, the second phase interpolator for phase mixing a second selected pair of the first, second, third and fourth intermediate signals in response to the control voltage signal to produce a second output signal that is 90 degrees out of phase with the first output signal such that a phase of the second output signal is a sum of weighted fractions of each phase of the selected intermediate signals of the second selected pair;

a frequency doubler circuit coupled to receive the first output signal and the second output signal, the frequency doubler circuit for generating the output signal in response to the first and second output signals, the output signal having an output frequency equal to the input frequency; and a phase selector circuit coupled to the first phase interpolator circuit and coupled to receive a phase slope signal and the control voltage signal, the phase selector circuit for selecting the first and second selected pairs in response to the phase slope signal and the control voltage signal such that the output signal varies in phase from the input signal by the predetermined phase difference, wherein the phase selector circuit includes:

a quadrant boundary detector for outputting a MAX signal when the control voltage is at a maximum voltage level and a MIN signal when the control voltage is at a minimum voltage level, the MAX and MIN signals indicating when a weighted fraction for a selected intermediate signal of the first selected pair is equal to zero;

a phase selector state machine coupled to receive the MAX signal, the MIN signal and the phase slope signal, the phase selector for selecting the selected pair in response to the MAX signal, the MIN signal and the phase slope signal by asserting as active two of a plurality of select signals, said plurality of select signals including an ISEL signal, an ISELB signal, a QSEL signal and a QSELB signal.

6. The phase shift apparatus of claim 5, wherein the control voltage is a differential voltage VC+ and VC−, the first phase interpolator comprising:

a first transistor including a first terminal for receiving a supply current, a second terminal for dispensing the supply current, and a third terminal for controlling the amount of supply current flowing from the first terminal of the first transistor to the second terminal of the first transistor in response to VC+;

a second transistor including a first terminal for receiving a supply current, a second terminal for dispensing the supply current, and a third terminal for controlling the amount of supply current flowing from the first terminal of the second transistor to the second terminal of the second transistor in response to VC−;

a first capacitor having a first terminal and a second terminal, wherein the first terminal of the first capacitor is coupled to system ground;

a second capacitor having a first terminal and a second terminal, wherein the first terminal Of the second capacitor is coupled to system ground;

a comparator having a negative input coupled to the second terminal of the first capacitor and a positive input coupled to the second terminal of the second capacitor, the comparator for outputting the output voltage;

a phase mixer circuit including a first input coupled to the second terminal of the first transistor, a second input coupled to the second terminal of the second transistor, a first output coupled to the second terminal of the first capacitor, and a second output coupled to the second terminal Of the second capacitor, the phase mixer circuit for coupling and decoupling the first input to the first output in response to a selected one of the first and third intermediate signals, and for coupling and decoupling the second input to the second output in response to a selected one of the second and fourth intermediate signals.

7. The phase shift apparatus of claim 3, wherein the phase mixer circuit couples and decouples the first input to the second output in response to the third intermediate signal when the first intermediate signal is selected to couple and decouple the first input to the first output.

8. A phase shift circuit comprising:

a differential amplifier including a pair of inputs and a pair of outputs, the pair of inputs being coupled to receive differential control voltage VC− and VC+;

a phase mixer including a first pair of inputs coupled to the outputs of the differential amplifier, a second pair of inputs coupled to a pair of quadrature signals, a first output, and a second output, the phase mixer providing current supplied by the outputs of the differential amplifier to the first and second outputs in response to the pair of quadrature signals;

a first capacitive element coupled between ground and the first output of the phase mixer;

a second capacitive element coupled between ground the second output of the phase mixer; and a comparator having a first input coupled to the first output of the phase mixer and a second input coupled to the second output of the phase mixer, wherein the comparator outputs a phase shifted signal in response to the first and second capacitive elements being charged and discharged by the phase mixer.

9. The phase shift circuit of claim 8, wherein the pair of quadrature signals are selected from a group of signals that are 0°, 90°, 180°, and 270° out of phase with a reference signal.

10. The phase shift circuit of claim 8, wherein the differential amplifier comprises:

a first transistor including a gate coupled to differential control voltage VC+, a drain, and a source coupled between a common node and a first supply voltage wherein the drain of first transistor is coupled as one of the pair of outputs;

a first current source load coupled between the drain of the first transistor and the first supply voltage;

a second transistor including a gate coupled to differential control voltage VC−, a drain, and a source coupled to the common node wherein the drain of the second transistor is coupled as another of the pair of outputs;

a second current source load coupled between the drain of the second transistor and the first supply voltage; and a third current source coupled between the common node and a second supply voltage.

* * * * *